(12) United States Patent
Shin et al.

(10) Patent No.: US 6,570,205 B2
(45) Date of Patent: May 27, 2003

(54) DRAM CELL

(75) Inventors: Chul-Ho Shin, Kyunggi-do (KR); Kyeong-Koo Chi, Seoul (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/038,911

(22) Filed: Jan. 8, 2002

(65) Prior Publication Data

US 2002/0109155 A1 Aug. 15, 2002

(30) Foreign Application Priority Data

Feb. 9, 2001 (KR) .......................................... 2001-6408

(51) Int. Cl.[7] .......................................... H01L 27/108
(52) U.S. Cl. ........................................................ 257/296
(58) Field of Search ................................ 257/296, 300, 257/306, 311

(56) References Cited

U.S. PATENT DOCUMENTS

| | | | | |
|---|---|---|---|---|
| 5,436,187 A | * | 7/1995 | Tanigawa | .................. 438/396 |
| 6,403,996 B1 | * | 6/2002 | Lee | .............................. 257/256 |
| 6,417,097 B1 | * | 7/2002 | Hwang et al. | .............. 438/637 |
| 6,483,136 B1 | * | 11/2002 | Yoshida et al. | ............. 257/295 |

FOREIGN PATENT DOCUMENTS

JP         2001036044 A    *  2/2001    ......... H01L/21/768

* cited by examiner

*Primary Examiner*—Allan R. Wilson
(74) *Attorney, Agent, or Firm*—Volentine Francos, PLLC

(57) ABSTRACT

A method of manufacturing a DRAM cell includes forming an isolation layer on a given region of a substrate to define an active region having a plurality of line shaped sub-regions; forming at least a pair of cell transistors in each line shaped sub-region, each cell transistor of a pair having a common drain region and respective source regions; forming a bit line pad on each common drain region and a storage node pad on each source region; forming a bit line pad protecting layer pattern having portions parallel to the word line, that covers the bit line pad; and forming storage nodes on storage node pads. The storage nodes of the DRAM cell contact with the storage node pads and are insulated electrically from the bit line pad by the bit line pad protecting layer pattern.

8 Claims, 13 Drawing Sheets

DRAM CELL

The present application claims priority under 35 U.S.C. §119 Korean Patent Application No. 2001-6408, filed on Feb. 9, 2001, which is hereby incorporated by reference in its entirety for all purposes.

BACKGROUND OF THE INVENTION

1. Field of the Invention

The present invention relates to a semiconductor device and a method of manufacturing the same, and more particularly to a dynamic random access memory (DRAM) cell and a method of manufacturing the same.

2. Description of the Related Art

As the elements incorporated into a semiconductor device are integrated to a higher degree, the width of wires such as gate lines and bit lines and the distance therebetween have gradually decreased. Thus, in order to increase the alignment margin in a photolithography process for forming contact holes which penetrate a given region between the wires, self-aligned contact (SAC) techniques have been developed and used. Particularly, in the case of a highly integrated DRAM cell, a method of forming bit lines and storage node pads on common drain and source regions of cell transistors by using an SAC technique, and then forming storage node contact plugs and storage nodes on the storage node pads, is widely used.

FIG. 1 is a top plan view showing a portion of a cell array area of a conventional DRAM device. As illustrated, an active region is arranged in two dimensions on a semiconductor substrate. The active region has a plurality of line or bar shaped sub-regions 3a which are defined by an isolation layer. On the active region, a plurality of word lines 7 are disposed parallel to each other to cross the line shaped sub-regions 3a of the active region. Each line shaped sub-region 3a is crossed by two word lines 7, and thereby divided into three portions. One of the three portions that is between the two word lines 7 forms a common drain region, and the other two of the three portions that are on both sides of the common drain region form source regions. The common drain and source regions are selectively exposed by means of a pad separation pattern 17 disposed on a side of each line shaped sub-region 3a. On each source region, a storage node pad 21s is disposed, whereas on each common drain region, a bit line pad 21d is disposed. The bit line pad 21d is extended to the upper portion of the isolation layer adjacent to the common drain region. Over the word lines 7, a plurality of bit lines 27 are disposed to cross the word lines 7. Each bit line 27 is electrically connected with the bit line pads 21 d crossed therewith through bit line contacts 25.

FIGS. 2A, 3A, 4A, 5A and 6A are cross-sectional views taken along line 2A—2A of FIG. 1, showing the process steps of a conventional method of manufacturing a DRAM cell. FIGS. 2B, 3B, 4B, 5B and 6B are cross-sectional views taken along line 2B—2B of FIG. 1, also showing the process steps of the conventional method of manufacturing the DRAM cell and as corresponding to the steps in FIGS. 2A, 3A, 4A, 5A and 6A.

Referring to FIG. 2A and FIG. 2B, first, an isolation layer 3 is formed on a semiconductor substrate to define an active region having a plurality of line shaped sub-regions (3a of FIG. 1). On the substrate 1 having the active region, a gate oxide layer 5 is formed. Then, a word line pattern 10 having a plurality of line shaped portions disposed parallel to each other is formed on the whole surface of the substrate to cross the active region. The word line pattern 10 is composed of a conductive layer pattern 7 forming word lines and a word line capping layer pattern 9 deposited in order.

To form impurity regions 11d, 11s, ion implantation is carried out on the active region by using the word line pattern 10 and the isolation layer 3 as an ion implantation mask. The impurity regions 11d formed between two line shaped portions of the word line pattern 10 in each line shaped sub-region 3a of the active region form common drain regions of DRAM cell transistors, and the impurity regions 11s formed on both sides of each common drain region forms source regions of the DRAM cell transistors. Then, on side walls of each line shaped portion of the word line pattern 10, word line spacers 13 are formed. And then, a pad insulating layer 15 is formed on the whole surface of the substrate on which the word line spacers are formed.

Referring to FIG. 3A and FIG. 3B, a pad separation pattern 17 is formed on the pad insulating layer 15. The pad separation pattern 17 is formed by a photolithography process, using a photo-resist pattern as a mask. Then, the pad insulating layer 15 is etched by using the pad separation pattern 17 as a mask, to form bit line pad contact holes 19d exposing the common drain regions 11d and storage node pad contact holes 19s exposing the source regions 11s. At this time, the bit line pad contact holes 19d also expose portions of the isolation layer 3 adjacent the common drain regions 11d.

Referring to FIG. 4A and FIG. 4B, the pad separation pattern 17 is removed. Then, a doped polysilicon layer is formed on the whole surface of the substrate on which the pad separation pattern 17 is removed. Then, until the word line capping pattern 9 is exposed, the doped polysilicon layer is planarized to form bit line pads 21d and storage node pads 21s in the bit line pad contact holes 19d and the storage node pad contact holes 19s, respectively. Thereafter, a bit line insulating layer 23 is formed over the whole surface of the substrate on which the bit line pads 21d and storage node pads 21s are formed. Thereafter, the bit line insulating layer 23 is patterned to form bit line contact holes (25 of FIG. 1) exposing the bit line pads 21d.

Over the whole surface of the substrate, a conductive layer filling the bit line contact holes 25 and a bit line capping layer are continuously formed. Then, the bit line capping layer and the conductive layer are continuously patterned to form a bit line pattern 30 crossing the word line pattern 10. The bit line pattern 30 having a plurality of line shaped portions is composed of a conductive layer pattern 27 forming bit lines and a bit line capping layer pattern 29. The bit lines of the conductive layer pattern 27 are electrically connected with the bit line pads 21d through the bit line contacts. And then, on side walls of each line shaped portion of the bit line pattern 30, bit line spacers 31 are formed. Thereafter, an interlayer insulating layer 33 is formed over the whole surface of the substrate over which the bit line spacers 31 are formed.

Referring to FIG. 5A and FIG. 5B, the interlayer insulating layer 33 and the bit line insulating layer 23 are continuously patterned to form storage node plug contact holes exposing the storage node pads 21s. At this time, the bit line capping layer pattern 29 and the bit line spacers 31 function as an etch stop layer. Accordingly, a width of each storage node plug contact hole in a direction parallel to the line shaped portion of the word line pattern 10 is determined by distance between the line shaped portions of the bit line pattern 30. However, a width W of the storage node plug contact hole in a direction vertical to the line shaped portion of the word line pattern 10 is restricted by the bit line pad 21d, as shown in FIG. 5A. Namely, the bit line pads 21d adjacent to the storage node plug pads 21s have not been exposed by means of the storage node contact plug holes. Therefore, side walls of the storage node plug contact holes are spaced apart as much as a given distance D from the bit line pads 21d. As a result, maximizing cross-sectional area of each storage node plug contact hole is restricted.

Then, to fill the storage node plug contact holes, a conductive layer is formed over the whole surface of the substrate. And then, until the bit line capping layer pattern 29 is exposed, the conductive layer is planarized to form storage node plugs 35s in the storage node plug contact holes.

Referring to FIG. 6A and FIG. 6B, an etch stop layer 37 and a lower sacrificial insulating layer 39 are continuously formed over the whole surface of the substrate including the storage node plugs 35s. The etch stop layer 37 is formed of a layer of materials having an etch selectivity with respect to the lower sacrificial insulating layer 39 and the interlayer insulating layer 33. Then, the lower sacrificial insulating layer 39 and the etch stop layer 37 are continuously patterned to form storage node holes exposing the storage node plugs 35s. And then, a conformal conductive layer, i.e., a conformal doped polysilicon layer is formed over the whole surface of the substrate over which the storage node holes are formed. Thereafter, an upper sacrificial insulating layer is formed on the conformal conductive layer to fill the storage node holes. Until the upper surface of the lower sacrificial insulating layer 39 is exposed, the upper sacrificial insulating layer and the conformal conductive layer are continuously planarized. As a result, cylindrical shaped storage nodes 41 are formed in the storage node holes and an upper sacrificial insulating layer pattern 43 is formed.

According to the conventional method of manufacturing a DRAM cell as described above, the fabrication process is complicated. Also, the storage node pad 21s and the storage node plugs 35s are interposed between the storage nodes 41 and the source regions 11s, so that contact resistance therebetween is increased. Accordingly, a new method of decreasing the contact resistance and simplifying the fabrication process is required.

SUMMARY OF THE INVENTION

The present invention is therefore directed to a semiconductor device and a method of manufacturing the same, which substantially overcome one or more of the problems due to limitations and disadvantages of the related art.

To solve the above problems, it is an object of the present invention to provide an improved dynamic random access memory (DRAM) cell which can simplify the fabrication process and decrease contact resistance of storage nodes.

To solve the above problems, it is also another object of the present invention to provide an improved method of manufacturing a DRAM cell which can simplify the fabrication process and decrease contact resistance of storage nodes.

The above and other objects may be achieved by a DRAM cell and method of manufacturing the same as follows. The DRAM cell of the present invention includes an isolation layer formed on a region of a substrate and defining an active region of the substrate, the active region having line shaped sub-regions; a word line pattern formed on the active region as crossing the active region, the word line pattern having pairs of line shaped portions; bit line pads disposed on each line shaped sub-region between the line shaped portions of the word line pattern; storage node pads disposed on each line shaped sub-region on both sides of the bit line pads; a bit line pad protecting layer pattern having line shaped portions formed in parallel with the line shaped portions of the word line pattern that covers the bit line pads; and storage nodes respectively formed on the storage node pads. The storage nodes being directly in contact with the storage node pads and insulated electrically from the bit line pads by the bit line pad protecting layer pattern. Each line shaped portion of the word line pattern may be composed of a line shaped portion of a conductive layer pattern forming a word line and a line shaped portion of a word line capping layer pattern, deposited in order.

Also, the DRAM cell of the invention may include word line spacers formed on side walls of each line shaped portion of the word line pattern. Accordingly, each word line is enclosed by the word line capping layer pattern and the word line spacers.

Also, the DRAM cell of the invention may include a bit line pattern having at least one line shaped portion formed over the word line pattern to cross the line shaped portions of the word line pattern. The line shaped portions of the bit line pattern are interposed between adjacent storage nodes. The line shaped portion of the bit line pattern is composed of a line shaped portion of a conductive layer pattern and a line shaped portion of a bit line capping layer pattern, formed in order.

Also, the DRAM cell of the invention may include bit line spacers formed on side walls of the line shaped portion of the bit line pattern. Accordingly, each bit line is insulated from the storage nodes by the bit line spacers. The bit line is connected with the bit line pads through bit line contacts passing through the bit line pad protecting layer pattern.

The method of manufacturing a DRAM cell of the invention includes forming an isolation layer on a region of a substrate to define an active region of the substrate, the active region having line shaped sub-regions; forming a word line pattern on the active region to cross the active region, the word line pattern having at least a pair of line shaped portions; forming bit line pads on each line shaped sub-region between the line shaped portions of the word line pattern and storage node pads on each line shaped sub-region on both sides of the bit line pads; forming a bit line pad protecting layer pattern having line shaped portion formed in parallel with the line shaped portions of the word line pattern to cover the bit line pads; and forming storage nodes on each storage node pad. The storage nodes are contacted with the storage node pads and insulated electrically from the bit line pads by the bit line pad protecting layer pattern.

The step of forming the bit line pad protecting layer pattern may include forming a bit line pad protecting layer over an entire surface of the DRAM cell including the bit line pads and the storage pads, and patterning the bit line pad protecting layer. The bit line pad protecting pattern may be a silicon nitride layer.

The step of forming the storage nodes may include forming an insulated bit line pattern crossing the word line pattern over an entire surface of the DRAM cell including the bit line pad protecting layer pattern, forming a lower sacrificial layer, forming storage node holes exposing the storage node pads by patterning the lower sacrificial layer, and forming storage nodes in the storage node holes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and fully convey the scope of the invention. Like numbers refer to like elements throughout.

Figure 1:
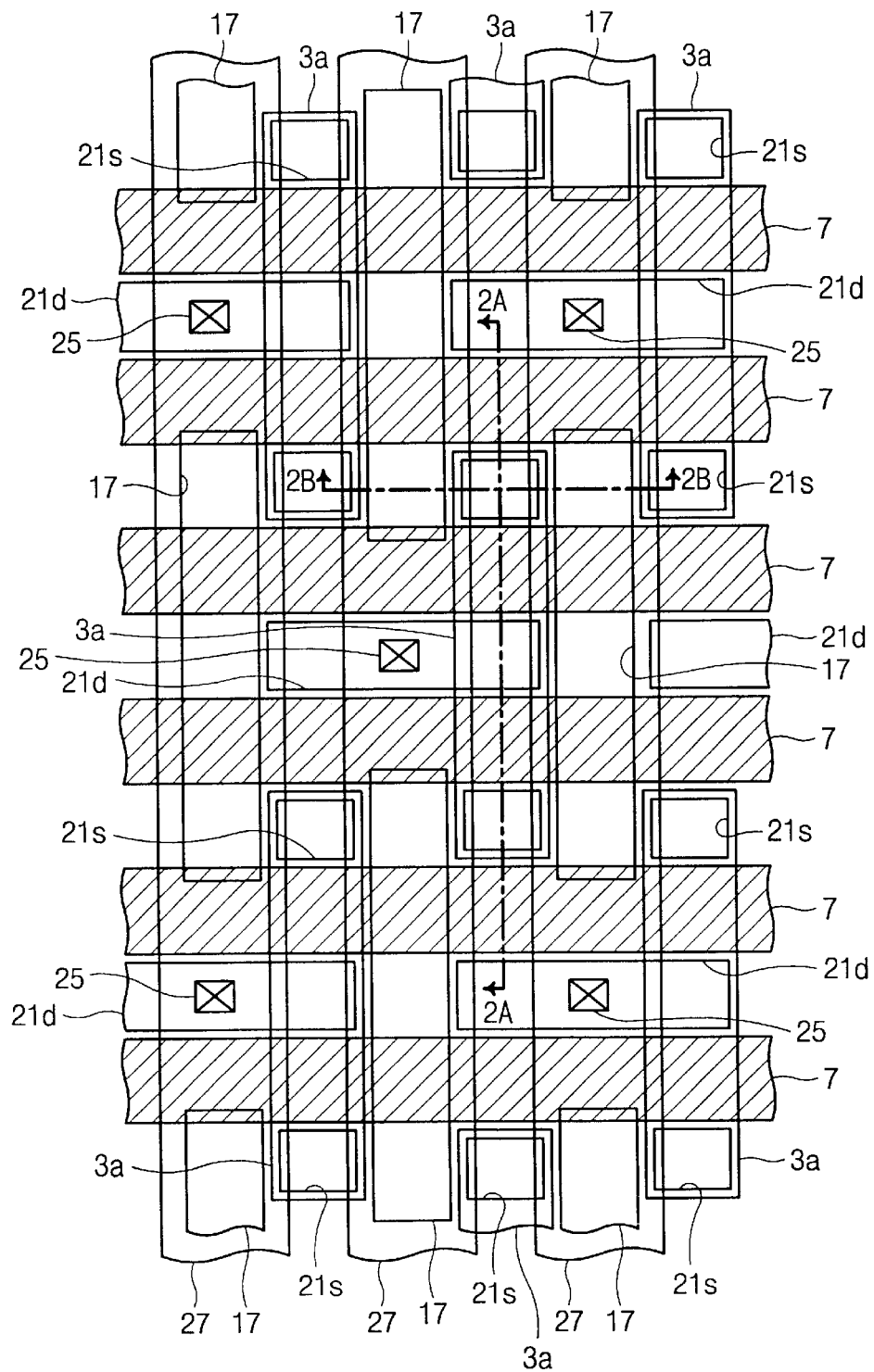
FIG. 1 is a top plan view showing a portion of a cell array area of a conventional DRAM device.
Figure 2A:
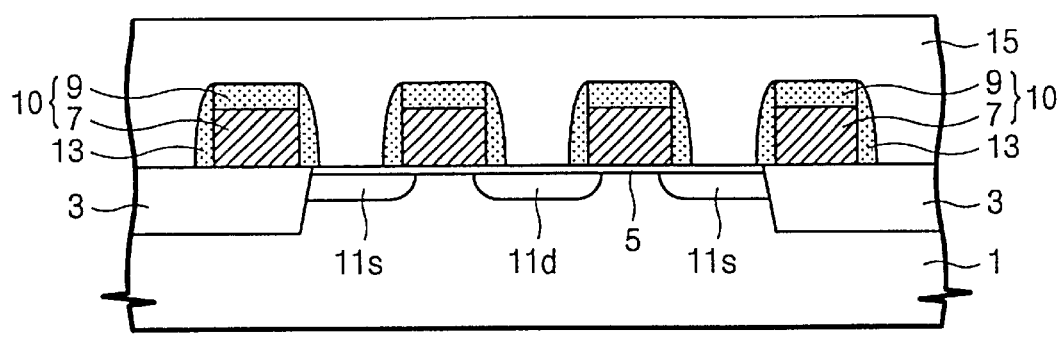
FIGS. 2A, 3A, 4A, 5A and 6A are cross-sectional views taken along line 2A—2A of FIG. 1, showing process steps of a conventional method of manufacturing a DRAM cell.
Figure 2B:
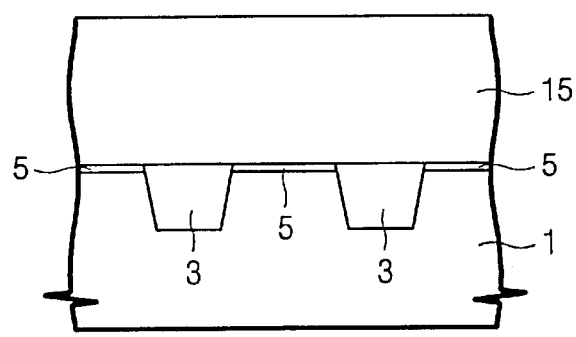
FIGS. 2B, 3B, 4B, 5B and 6B are cross-sectional views taken along line 2B—2B of FIG. 1, showing process steps of the conventional method of manufacturing a DRAM cell, and which correspond to FIGS. 2A, 3A, 4A, 5A and 6A.
Figure 3A:
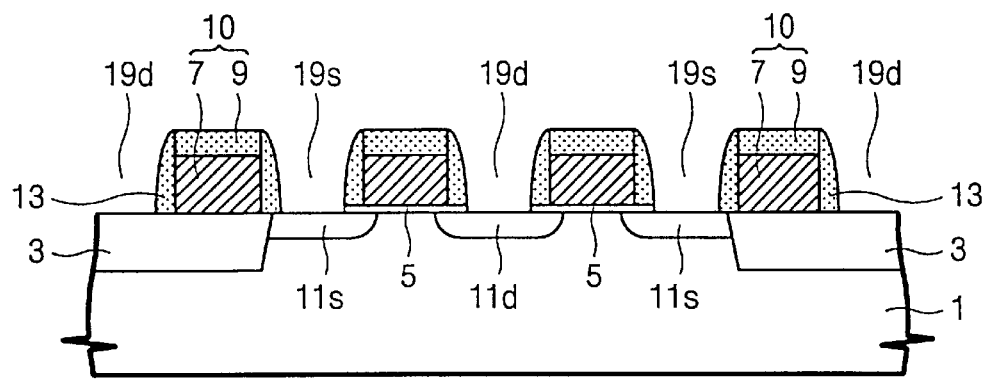
Figure 3B:
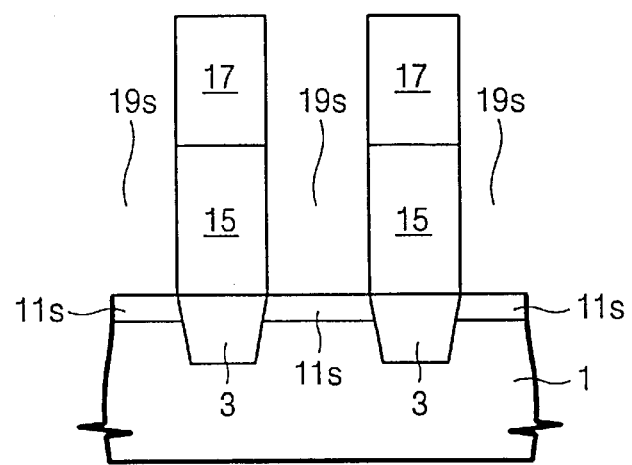
Figure 4A:
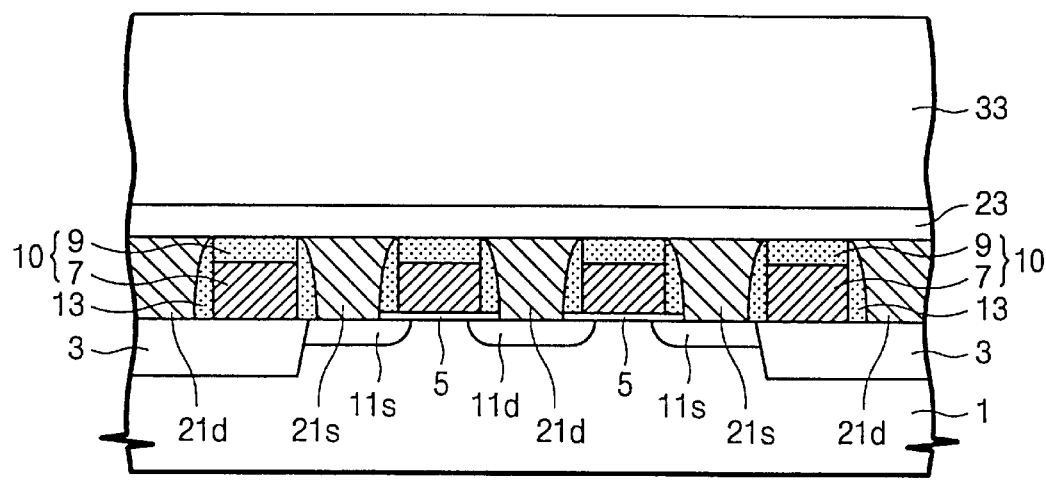
Figure 4B:
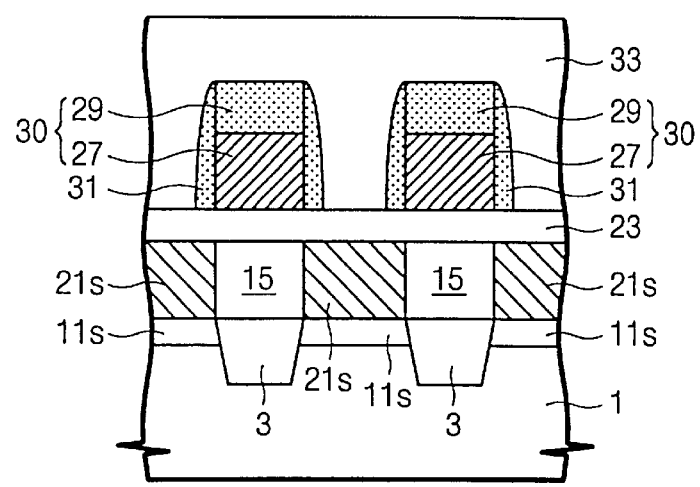
Figure 5A:
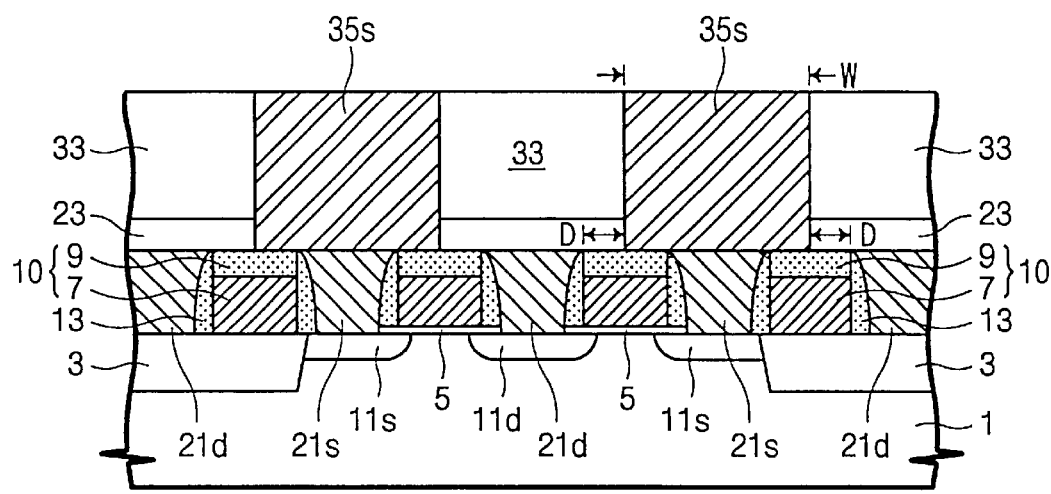
Figure 5B:
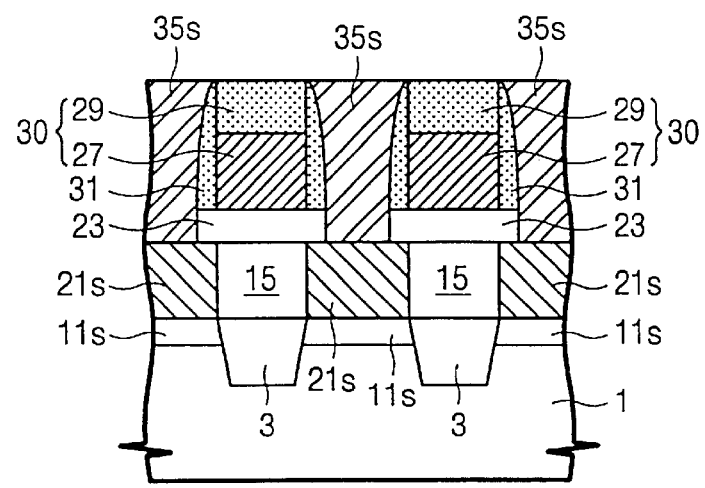
Figure 6A:
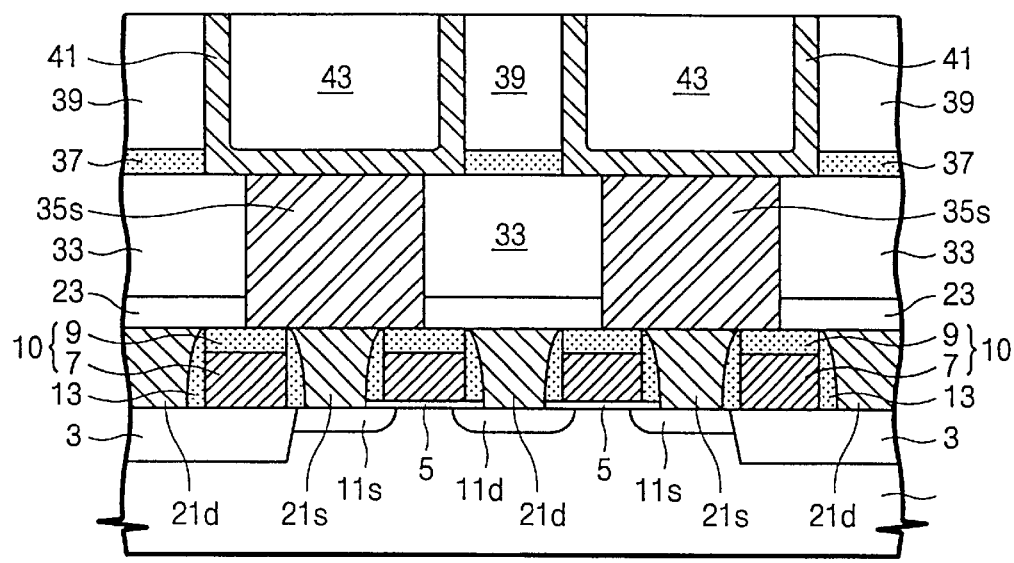
Figure 6B:
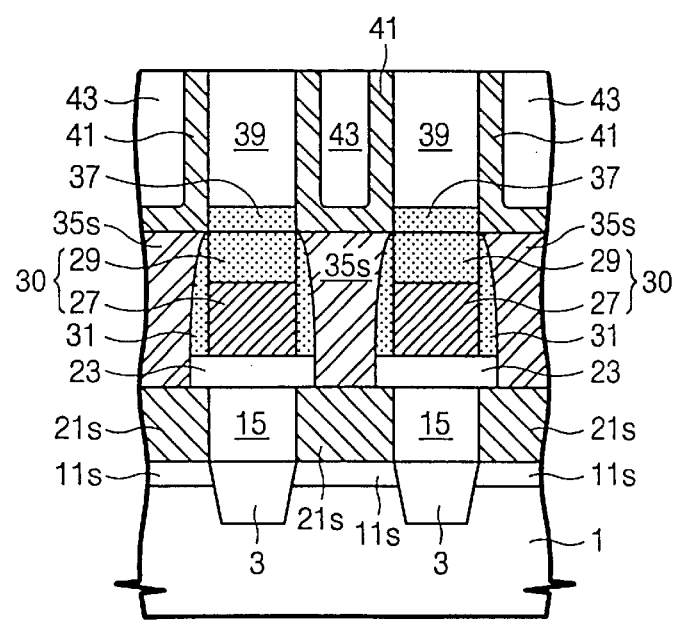
Figure 7:
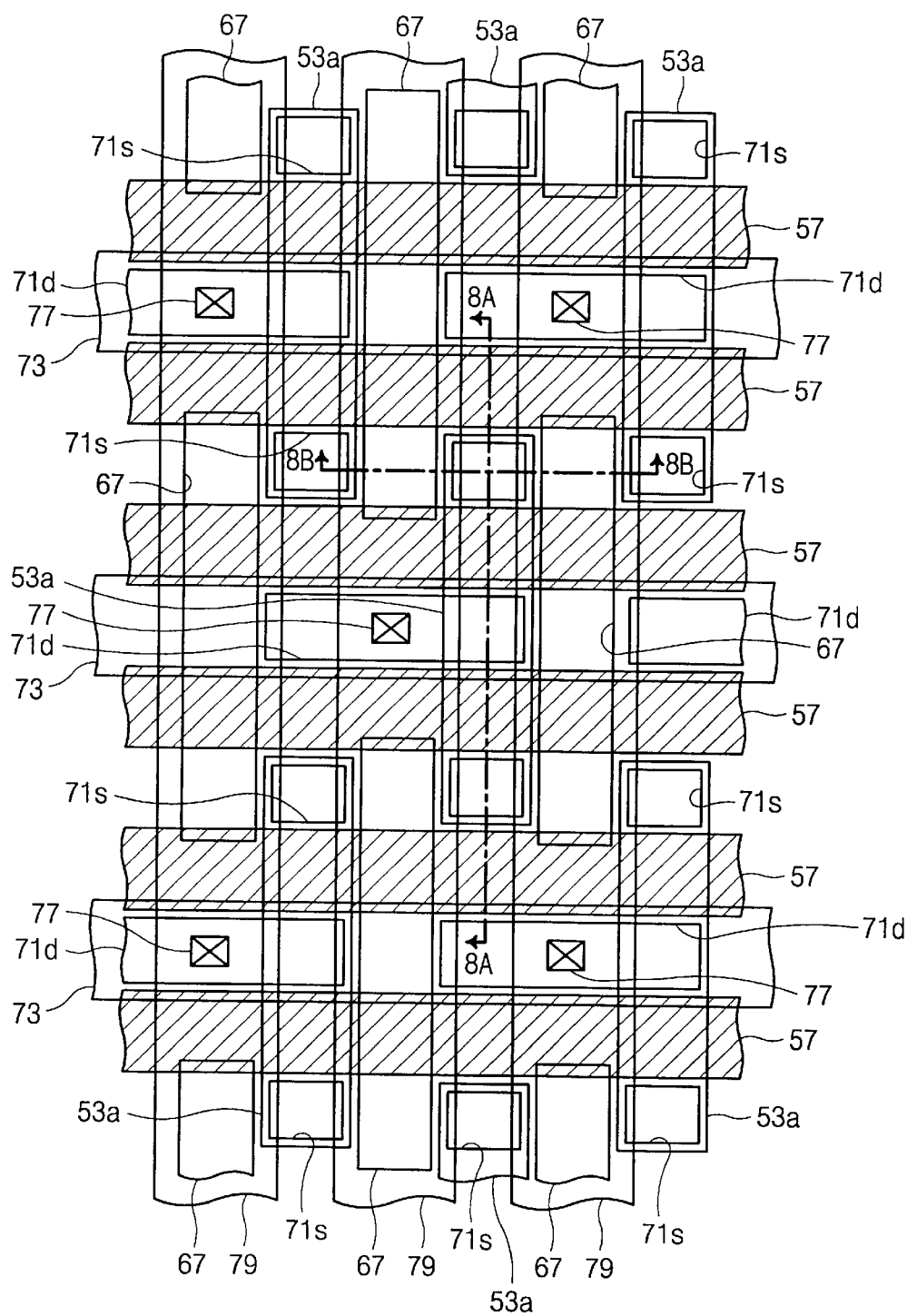
FIG. 7 is a top plan view showing a portion of a cell array area of a DRAM device in accordance with the present invention.

FIG. 7 is a top plan view showing a portion of a cell array area of a DRAM device in accordance with the present invention. Also, FIGS. 8A, 9A, 10A, 11A and 12A are cross-sectional views taken along line 8A—8A of FIG. 7, and FIGS. 8B, 9B, 10B, 11B and 12B are cross-sectional views taken along line 8B—8B of FIG. 7. FIG. 12A and FIG. 12B show cross-sections of a DRAM cell structure formed in accordance with the present invention.

Referring to FIG. 7, FIG. 12A and FIG. 12B, an isolation layer 53 is disposed on a given region of a semiconductor substrate 51. The isolation layer 53 defines an active region which is arranged in two dimensions on the substrate 51. The active region has a plurality of line shaped sub-regions 53a which are defined by the isolation layer 53. On the active region, a word line pattern 60 having a plurality of line shaped portions is arranged to cross the active region. Namely, the line shaped portions of the word line pattern 60 are disposed parallel to each other to cross the line shaped sub-regions 53a of the active region. The word line pattern 60 is composed of a conductive layer pattern 57 forming word lines and a word line capping pattern 59 deposited in order. Each line shaped sub-region 53a of the active region is crossed by two line shaped portions of the word line pattern 60, and is thereby divided into three portions. One of the three portions that is between the two line shaped portions forms a common drain region 61d, and the other two of the three portions that are positioned on both sides of the common drain region 61d form source regions 61s. On side walls of each line shaped portion of the word line pattern 60, word line spacers 63 are disposed, and between the word line pattern 60 and the active region, a gate insulating layer 55 is interposed.

The common drain and source regions 61d, 61s are selectively exposed by means of a pad separation pattern 67 disposed on a side of each line shaped sub-region 53a. On each source region 61s, a storage node pad 71s is disposed, whereas on each drain region 61d, a bit line pad 71d is disposed. The bit line pads 71d extend to the upper portion of the isolation layer 53 adjacent to the common drain regions 61d. The bit line pads 71d are covered by means of a bit line pad protecting layer pattern 73 formed parallel to the word line pattern 60. Over the word line pattern 60, a bit line pattern 83 is disposed to cross the word line pattern 60. The bit line pattern 83 having a plurality of line shaped portions is composed of a conductive layer pattern 79 forming bit lines and a bit line capping layer pattern 81. The bit lines of the conductive layer pattern 79 are electrically connected with the bit line pads 71d crossed therewith, through bit line contacts passing through the bit line pad protecting layer pattern 73.

On the storage node pads 71s, cylindrical shaped storage nodes 93 are disposed. The storage nodes 93 are directly in contact with the storage node pads 71s. The storage nodes 93 are insulated from the bit line pads 71d by means of the bit line pad protecting pattern 73. Each of the line shaped portions of the bit line pattern 83 are interposed between the adjacent storage nodes 93 positioned on a straight line parallel to the word lines. The storage nodes 93 are electrically insulated from the bit lines of the conductive layer pattern 79 by means of bit line spacers 85 positioned on side walls of the line shaped portions of the bit line pattern 83. On the storage nodes 93, a dielectric layer 97 and plate electrode 99 are disposed.

A method of manufacturing a DRAM cell in accordance with the present invention will now be described with reference to the drawings. FIGS. 8A, 9A, 10A, 11A and 12A are cross-sectional views taken along line 8A—8A of FIG. 7, showing process steps of a method of manufacturing a DRAM cell in accordance with the present invention. FIGS. 8B, 9B, 10B, 11B and 12B are cross-sectional views taken along line 8B—8B of FIG. 7, showing process steps of the method of manufacturing a DRAM cell, and which correspond to FIGS. 8A, 9A, 10A, 11A and 12A.

Figure 8A:
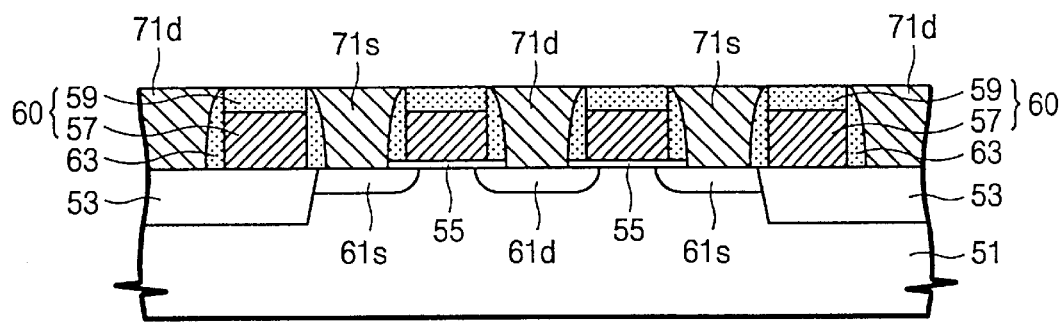
FIGS. 8A, 9A, 10A, 11A and 12A are cross-sectional views taken along line 8A—8A of FIG. 7, showing process steps of a method of manufacturing a DRAM cell in accordance with the present invention.
Figure 8B:
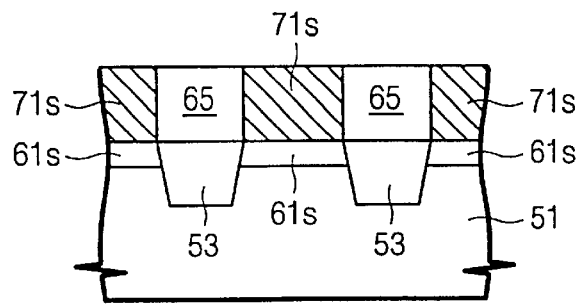
FIGS. 8B, 9B, 10B, 11B and 12B are cross-sectional views taken along line 8B—8B of FIG. 7, showing process steps of a method of manufacturing a DRAM cell, and which correspond to FIGS. 8A, 9A, 10A, 11A and 12A.

Referring to FIG. 8A and FIG. 8B, first, an isolation layer 53 is formed on a given region of a semiconductor substrate 51 to define an active region having a plurality of line shaped sub-regions (53a of FIG. 7). On the substrate having the active region, a gate oxide layer 55 is formed. Then, a conductive layer and a word line capping layer are continuously formed on the whole surface of the substrate on which the gate oxide layer 55 is formed. The conductive layer may be composed of a doped polysilicon layer or a metal polycide layer. Also, the word line capping layer may be an insulating layer, for example a silicon nitride layer having an etch selectivity with respect to a silicon oxide layer, which is commonly used as an interlayer insulating layer. And then, the conductive layer and the word line capping layer are continuously patterned to form a word line pattern 60. The word line pattern 60 has a plurality of line shaped portions disposed parallel to each other to cross the line shaped sub-regions 53a of the active region. Also, the word line pattern 60 is composed of a conductive layer pattern 57 forming word lines and a word line capping layer pattern 59 deposited in order.

To form impurity regions 61d, 61s, an ion implantation is carried out on the active region by using the word line pattern 60 and the isolation layer 53 as an ion implantation mask. During the ion implantation, an impurity such as phosphorus ions with a dose of $1.0 \times 10^{12}$ to $1.0 \times 10^{14}$ ion atoms/cm$^2$ is used. The impurity regions 61d formed between two line shaped portions of the word line pattern 60 in each line shaped sub-region 53a of the active region form common drain regions of DRAM cell transistors, and the impurity regions 61s formed on both sides of each common drain region form source regions of the DRAM cell transistors.

Then, on side walls of each line shaped portion of the word line pattern 60, word line spacers 63 are formed in a conventional manner. The word line spacers 63 may be formed of a layer of the same material as that of the word line capping layer pattern 59. And then, a pad insulating layer 65, for example a silicon oxide layer is formed on the whole surface of the substrate on which the word line spacers 63 are formed. Thereafter, a pad separation pattern (67 of FIG. 7) is formed on the pad insulating layer 65. The pad separation pattern 67 has a plurality of line or bar shaped portions, each of which is disposed on a side of each line shaped sub-region 53a of the active region. The pad separation pattern 67 is formed by a photolithography process, using a photo-resist pattern as a mask.

Next, the pad insulating layer 65 is etched by using the pad separation pattern 67 as a mask, to form bit line pad contact holes exposing the common drain regions 61d and storage node pad contact holes exposing the source regions 61s. At this time, the word line capping layer pattern 59 and the word line spacers 63 function as an etch stop layer. Also, the bit line pad contact holes expose portions of the isolation layer 53 adjacent the common drain regions 61d. Then, a conductive layer, for example a doped polysilicon layer is formed on the whole surface of the substrate to fill the pad contact holes. And then, until the word line capping pattern 59 is exposed, the conductive layer is planarized to form bit line pads 71d and storage node pads 71s in the bit line pad contact holes and the storage node pad contact holes, respectively. As a result, the bit line pads 71d cover portions of the isolation layer 53 adjacent to the common drain regions 61d, as well as the common drain regions 61d, as shown in FIG. 7.

Figure 9A:
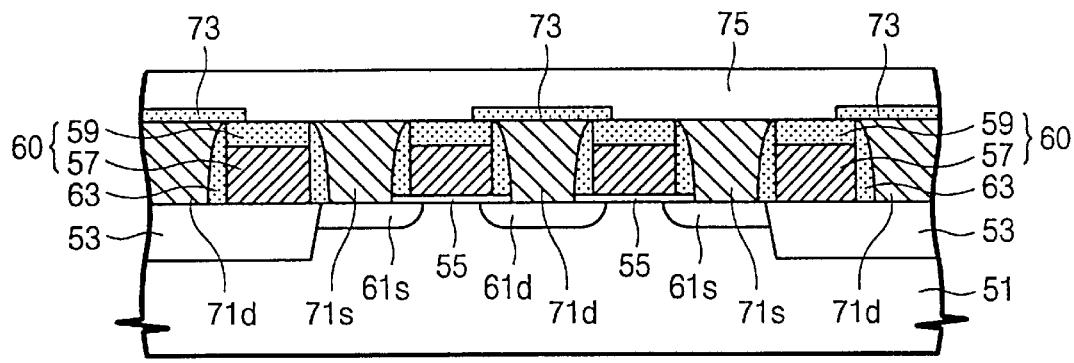
Figure 9B:
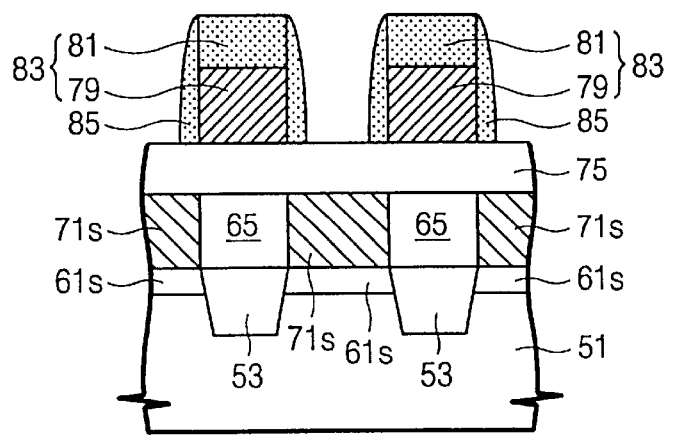

Referring to FIG. 9A, and FIG. 9B, a bit line pad protecting layer is formed over the whole surface of the substrate including the bit line pads 71d and the storage node pads 71s. The bit line pad protecting layer may be composed of an insulating layer, for example a silicon nitride layer having an etch selectivity with respect to a silicon oxide layer. Then, the bit line pad protecting layer is patterned to form a bit line pad protecting layer pattern 73 disposed parallel to the word line pattern 60, while covering the bit line pads 71d. And then, a bit line insulating layer 75 is formed over the whole surface of the substrate having the bit line pad protecting layer pattern 73. The bit line insulating layer 75 may be composed of a silicon oxide layer.

Thereafter, the bit line insulating layer 75 and the bit line pad protecting layer pattern 73 are continuously patterned to form bit line contact holes (77 of FIG. 7) exposing the bit line pads 71d. On the whole surface of the substrate having the bit line contact holes, a conductive layer filling the bit line contact holes and a bit line capping layer are continuously formed of a tungsten layer or a tungsten polycide layer, and an insulating layer, for example a silicon nitride layer having an etch selectivity with respect to a silicon oxide layer, respectively. Then, the bit line capping layer and the conductive layer are patterned to form a bit line pattern 83 covering the bit line contact holes and crossing the line shaped portions of the word line pattern 60. The bit line pattern 83 having a plurality of line shaped portions is composed of a conductive layer pattern 79 forming bit lines and a bit line capping layer pattern 81. On side walls of each line shaped portion of the bit line pattern 83, bit line spacers 85 are formed. The bit line spacers 85 are composed of a insulating layer, for example a silicon nitride layer having an etch selectivity with respect to a silicon oxide layer.

Figure 10A:
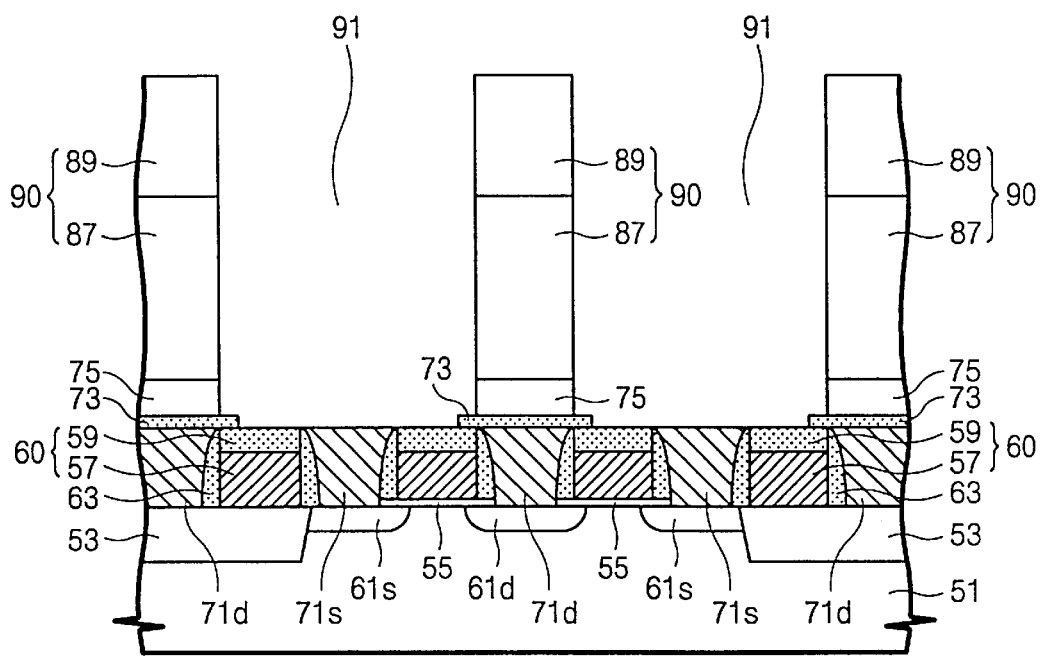
Figure 10B:
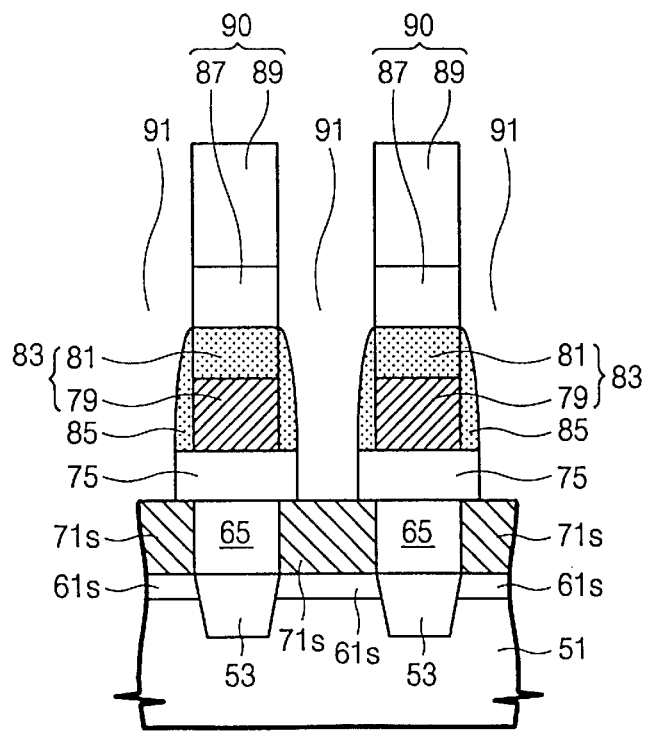

Referring to FIG. 10A, and FIG. 10B, a lower sacrificial layer 90 is formed over the whole surface of the substrate over which the bit line pattern 83 is formed. The lower sacrificial layer 90 may be formed by depositing a lower sacrificial insulating layer 87 and a chemical-mechanical polishing stop layer 89 in order. Also, the lower sacrificial insulating layer 87 and the chemical-mechanical polishing stop layer 89 may be composed of a silicon oxide layer and a silicon nitride layer, respectively. Then, the lower sacrificial layer 90 and the bit line insulating layer 75 are continuously patterned to form storage node holes 91 exposing the storage node pads 71s. At this time, the bit line pad protecting layer pattern 73, the bit line capping layer pattern 81 and the bit line spacers 85 act as an etch stop layer. Thus, even though the storage node holes 91 are mis-aligned along a direction parallel to the line shaped portions of the bit line pattern 83 during a photolithography process, the bit line pads 71d are not exposed due to the bit line pad protecting layer pattern 73.

Figure 11A:
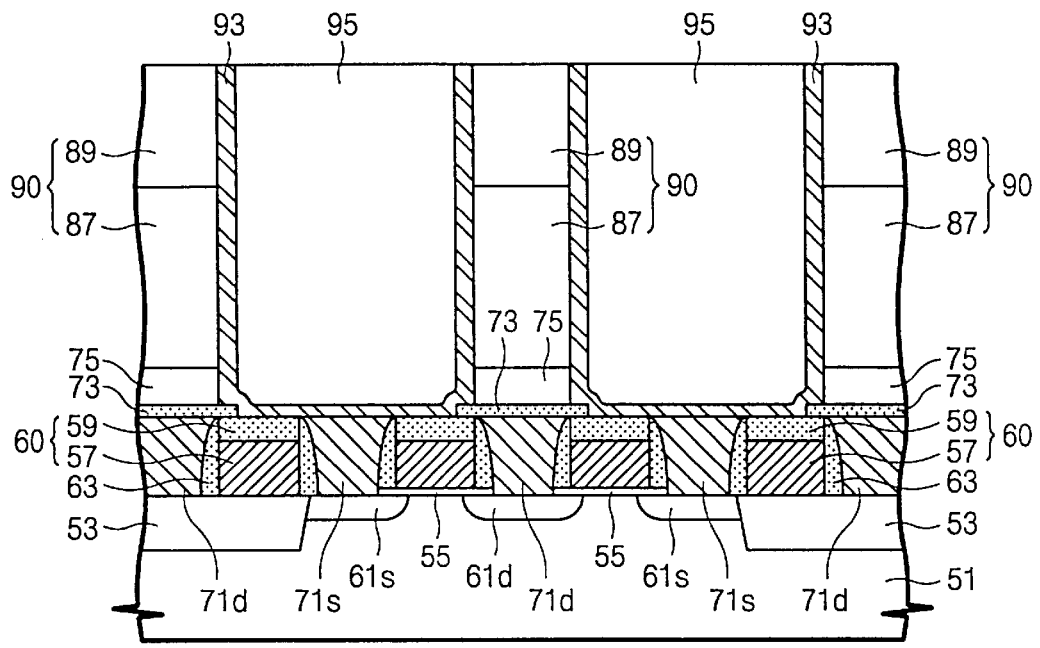
Figure 11B:
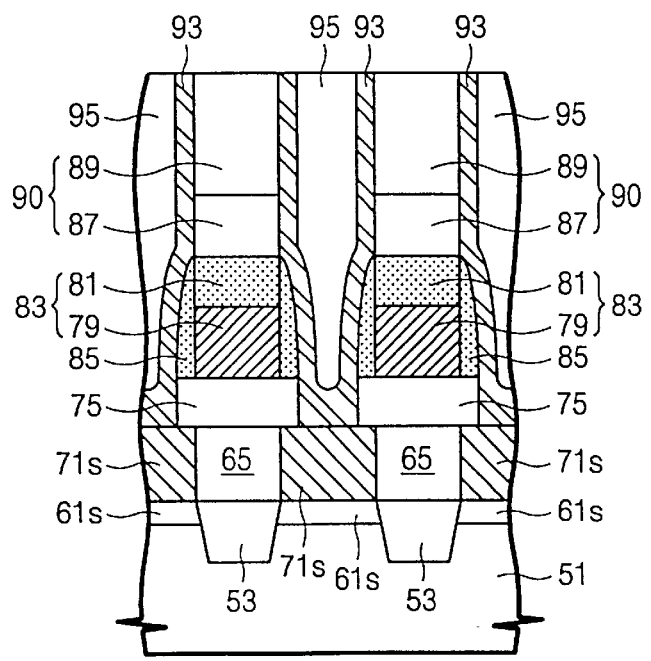
Figure 12A:
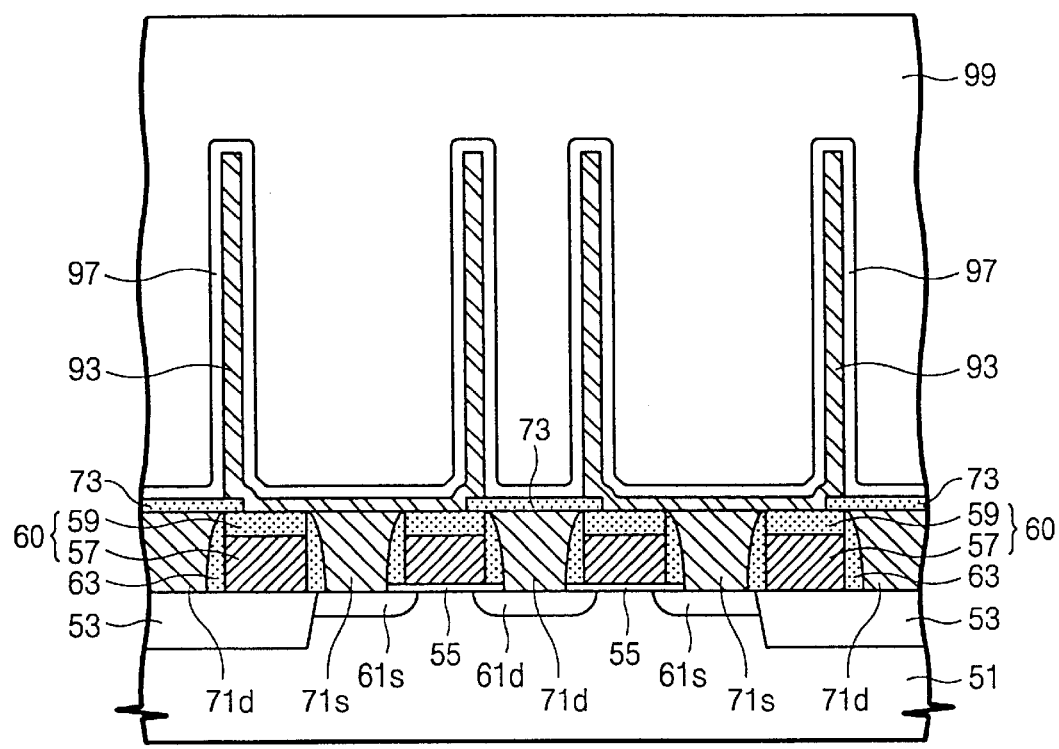
Figure 12B:
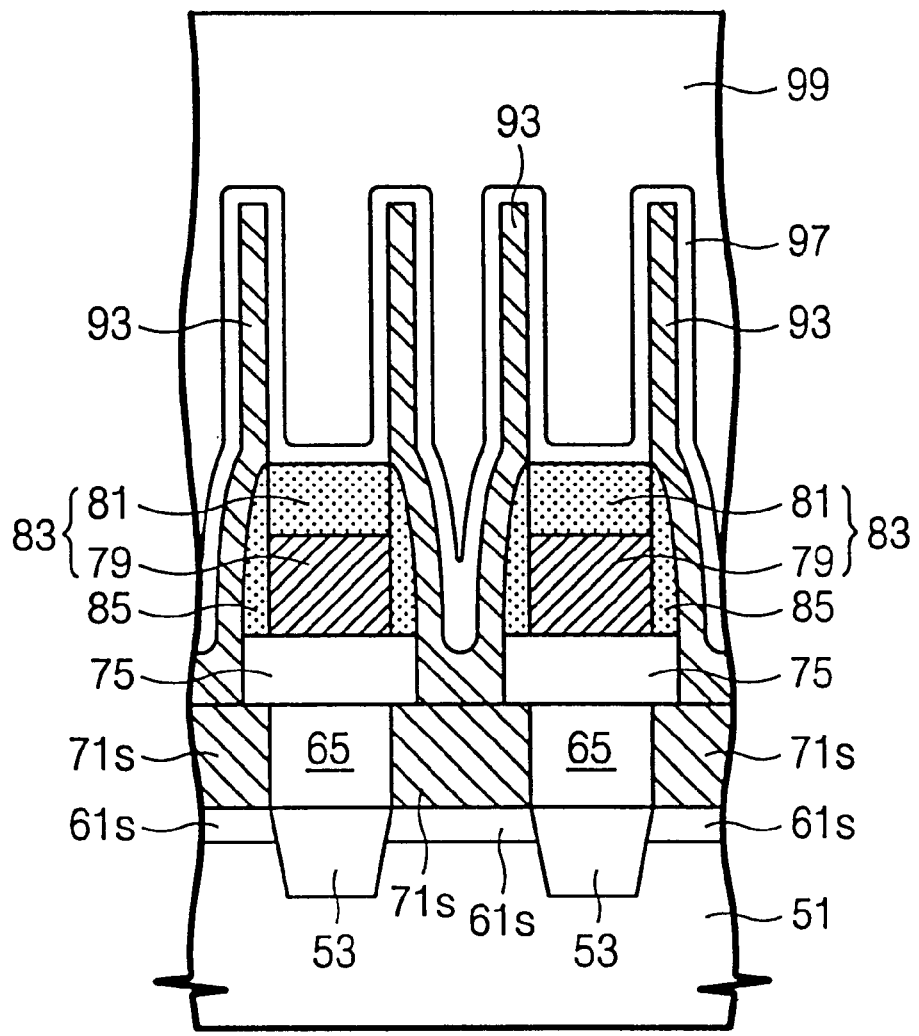

Referring to FIG. 11A and FIG. 11B, a conformal conductive layer, for example a doped polysilicon layer, is formed over the whole surface of the substrate having the storage node holes 91. Then, an upper sacrificial layer is formed on the conformal conductive layer to fill completely the storage node holes. The upper sacrificial layer may be composed of a layer of the same material as that of the lower sacrificial insulating layer 87. And then, until the chemical-mechanical polishing stop layer 89 is exposed, the upper sacrificial layer and the conductive layer are continuously patterned to form cylindrical shaped storage nodes 93 in the storage node holes 91. At this time, an upper sacrificial layer pattern 95 is formed in the storage node 93.

Referring to FIG. 12A and FIG. 12B, the chemical-mechanical polishing stop layer 89 is removed. Then, the lower sacrificial insulating layer 87, the bit line insulating layer 75, and the upper sacrificial layer pattern 95 are removed to expose inner walls and outer side walls of the storage nodes 93. And then, a dielectric layer 97 and plate electrode 99 are formed over the whole surface of the substrate over which the inner walls and outer side walls of the storage nodes 93 are formed.

As apparent from the foregoing description, it can be appreciated that the present invention provides a DRAM cell and a method of forming the same, in which storage nodes are directly contacted with and on storage node pads and are insulated electrically from bit line pads by means of a bit line pad protecting pattern, thereby decreasing contact resistance of storage nodes. In the drawings and specification, there has been disclosed typical preferred embodiments of the invention and, although specific terms are employed, they are used in generic and descriptive sense only, and should not be construed as limiting.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A DRAM cell comprising:

an isolation layer formed on a region of a substrate and defining an active region of the substrate, said active region having line shaped sub-regions;

a word line pattern formed on said active region as crossing said active region, said word line pattern having pairs of line shaped portions;

impurity regions, formed in said active region, including common drain regions respectively formed between line shaped portions of said pairs of line shaped portions of said word line pattern in said line shaped sub-regions of said active region, and source regions respectively formed on both sides of the line shaped portions opposite said common drain regions in said line shaped sub-regions;

word line spacers formed on side walls of said word line pattern;

bit line pads formed on said common drain regions;

storage node pads formed on said source regions;

a bit line pad protecting layer pattern, having line shaped portions formed in parallel with said pairs of line shaped portions of said word line pattern, that covers said bit line pads; and storage nodes formed on said storage node pads, said storage nodes being respectively in direct contact with said storage node pads and insulated electrically from said bit line pads by said bit line pad protecting layer pattern.

2. The DRAM cell according to claim 1, wherein said word line pattern comprises a conductive layer pattern forming word lines and a word line capping pattern, formed in order on the substrate.

3. The DRAM cell according to claim 1, further comprising a bit line pattern, formed over said word line pattern and crossing said word line pattern, having line shaped portions interposed between said storage nodes and positioned along straight lines perpendicular to said pairs of line shaped portions of said word line pattern.

4. The DRAM cell according to claim 3, wherein said bit line pattern includes a bit line layer pattern forming bit lines and a bit line capping pattern formed on the bit line layer pattern.

5. The DRAM cell according to claim 3, further comprising bit line spacers formed on side walls of said bit line pattern.

6. The DRAM cell according to claim 4, wherein said bit lines of said bit line layer pattern are electrically connected with said bit line pads through bit line contacts passing through said bit line pad protecting layer pattern.

7. The DRAM cell according to claim 1, further comprising a dielectric layer and plate electrode formed in order on said storage nodes.

8. The DRAM cell according to claim 1, wherein said storage nodes have cylindrical shape.

* * * * *